(12) United States Patent
Hatano et al.

(10) Patent No.: US 12,033,878 B2
(45) Date of Patent: *Jul. 9, 2024

(54) SUBSTRATE TRANSFER APPARATUS AND SUBSTRATE PROCESSING SYSTEM

(71) Applicant: Tokyo Electron Limited, Tokyo (JP)

(72) Inventors: Tatsuo Hatano, Yamanashi (JP); Tetsuya Miyashita, Yamanashi (JP); Naoki Watanabe, Yamanashi (JP); Naoyuki Suzuki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/230,929

(22) Filed: Aug. 7, 2023

(65) Prior Publication Data

US 2023/0377927 A1 Nov. 23, 2023

Related U.S. Application Data

(63) Continuation of application No. 17/779,873, filed as application No. PCT/JP2020/043454 on Nov. 20, 2020, now Pat. No. 11,764,092.

(30) Foreign Application Priority Data

Nov. 29, 2019 (JP) ................................. 2019-217076

(51) Int. Cl.
*H01L 21/677* (2006.01)
*B25J 9/02* (2006.01)
(Continued)

(52) U.S. Cl.
CPC .......... *H01L 21/67742* (2013.01); *B25J 9/02* (2013.01); *B25J 9/12* (2013.01); *B25J 11/0095* (2013.01);
(Continued)

(58) Field of Classification Search
CPC ....... H01L 21/67742; B25J 9/12; H01K 41/02
See application file for complete search history.

(56) References Cited

U.S. PATENT DOCUMENTS 7,224,252 B2 * 5/2007 Meadow, Jr. .... A63B 21/00192
310/12.24
10,926,418 B2 * 2/2021 Lu ............................ H02K 7/14
(Continued)

FOREIGN PATENT DOCUMENTS

JP 06120317 A * 4/1994
JP 2017-168866 A 9/2017
(Continued)

OTHER PUBLICATIONS

International Search Report issued on Jan. 12, 2021 for WO 2021/106796 A1 (4 pages).

*Primary Examiner* — Gerald McClain
(74) *Attorney, Agent, or Firm* — Venjuris, P.C.

(57) ABSTRACT

A substrate transfer apparatus includes a planar motor provided in a transfer chamber and having coils arranged therein, a transfer unit movable on the planar motor, and a control unit configured to control an energization of the coils. The transfer unit includes two bases having magnets arranged thereon and configured to be movable on the planar motor, a substrate support member configured to support a substrate, and a link mechanism configured to connect the two bases and the substrate support member to each other.

4 Claims, 11 Drawing Sheets

(51) Int. Cl.
  *B25J 9/12* (2006.01)
  *B25J 11/00* (2006.01)
  *H02K 7/14* (2006.01)
  *H02K 41/02* (2006.01)
  *H01L 21/67* (2006.01)
  *H01L 21/687* (2006.01)

(52) U.S. Cl.
  CPC ............... *H02K 7/14* (2013.01); *H02K 41/02* (2013.01); *H01L 21/67167* (2013.01); *H01L 21/67748* (2013.01); *H01L 21/68707* (2013.01)

(56) References Cited

U.S. PATENT DOCUMENTS

| | | | |
|---|---|---|---|
| 11,764,092 B2 * | 9/2023 | Hatano | H02K 41/02 414/222.13 |
| 2014/0227065 A1 | 8/2014 | Muller et al. | |

FOREIGN PATENT DOCUMENTS

| | | |
|---|---|---|
| JP | 2018-504784 A | 2/2018 |
| TW | 201124325 A | 7/2011 |
| TW | 201734672 A | 10/2017 |
| TW | 201827945 A | 8/2018 |

* cited by examiner

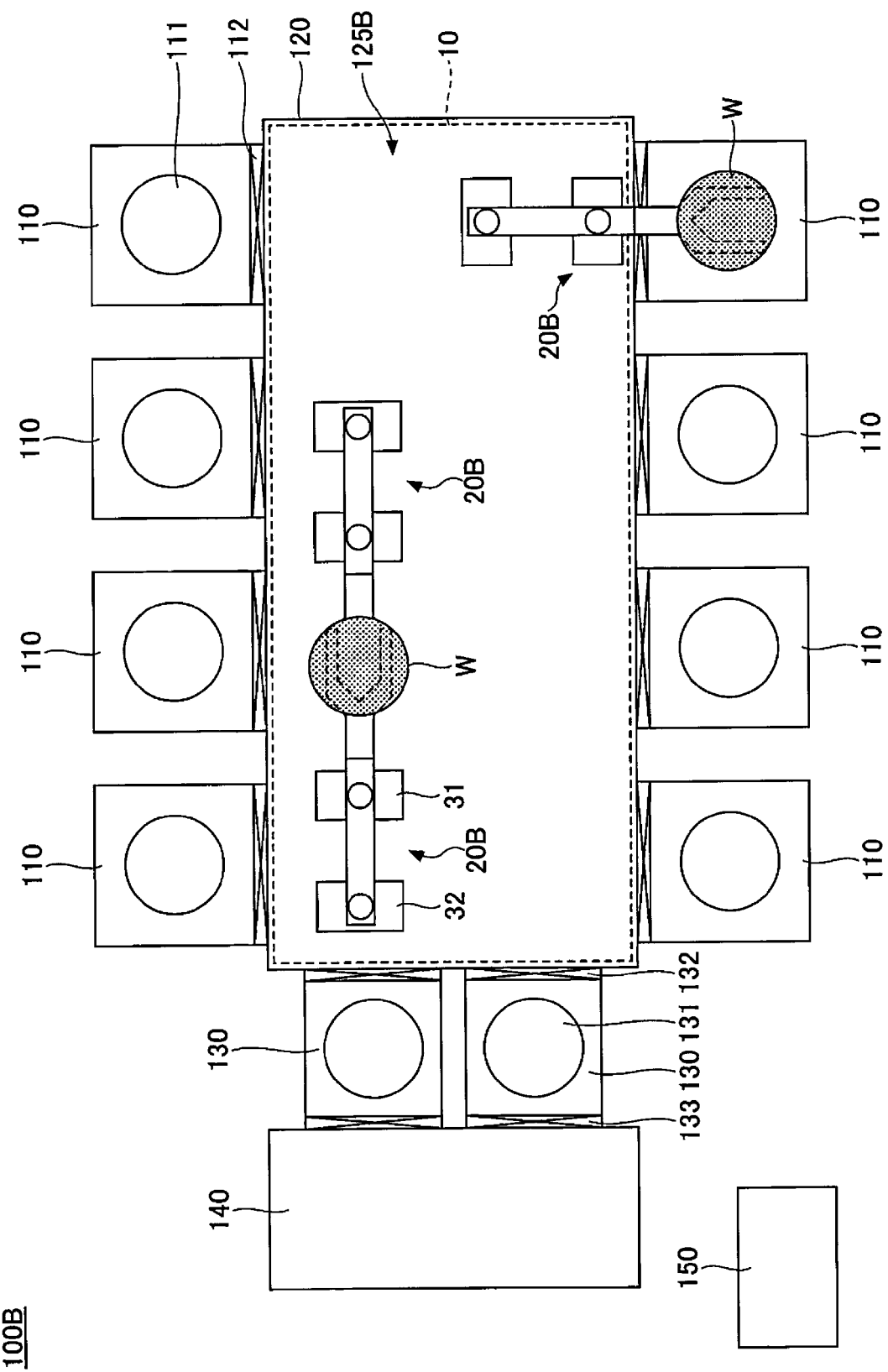

SUBSTRATE TRANSFER APPARATUS AND SUBSTRATE PROCESSING SYSTEM

CROSS REFERENCE TO RELATED APPLICATIONS

This application is continuation application of U.S. patent application Ser. No. 17/779,873, filed on May 25, 2022, which is a national phase of PCT application No. PCT/JP2020/043454, filed on 20 Nov. 2020, which claims priority from Japanese patent application No. 2019-217076, filed on 29 Nov. 2019, all of which are incorporated herein by reference.

TECHNICAL FIELD

The present disclosure relates to a substrate transfer apparatus and a substrate processing system.

BACKGROUND

For example, a substrate processing system is known which includes a plurality of processing chambers and a vacuum transfer chamber connected to the processing chambers. A substrate transfer apparatus for transferring a substrate is provided in the vacuum transfer chamber.

Patent Document 1 discloses a processing station including a plurality of processing modules and a transfer module. The transfer module is provided with a wafer transfer mechanism configured with multi-joint arms.

Patent Document 2 discloses a semiconductor processing equipment that transfers a substrate by using a planar motor.

PRIOR ART DOCUMENT

Patent Document

Patent Document 1: Japanese Laid-Open Patent Publication No. 2017-168866
Patent Document 2: Japanese National Publication of International Patent Application No. 2018-504784

SUMMARY OF THE INVENTION

Problem to be Solved

In the processing station disclosed in Patent Document 1, a plurality of multi-joint arms is provided in the transfer module having a vacuum atmosphere, in order to transfer the substrate to the plurality of processing modules. A motor which may cause a generation of dust is disposed outside the transfer module, a rotary shaft of the multi-joint arms is disposed penetrating the bottom of the transfer module, and the gap between the bottom and the rotary shaft is sealed by a magnetic seal. Thus, there is a problem in that it is difficult to keep the inside of the transfer module in a high vacuum. Further, the system disclosed in Patent Document 2 has a problem in that the handling of the system is poor, and it is necessary to widen the opening of a chamber.

An aspect of the present disclosure provides a substrate transfer apparatus for transferring a substrate.

Means to Solve the Problem

According to an aspect of the present disclosure, a substrate transfer apparatus includes: a planar motor provided in a transfer chamber and having coils arranged therein; a transfer device movable on the planar motor; and a control unit configured to control an energization of the coils. The transfer unit includes two bases having magnets arranged thereon and configured to be movable on the planar motor, a substrate support member configured to support a substrate, and a link mechanism configured to connect the two bases and the substrate support member to each other.

Effect of the Invention

An aspect of the present disclosure provides a substrate transfer apparatus for transferring a substrate.

BRIEF DESCRIPTION OF THE DRAWINGS

FIG. 5 is a plan view illustrating an example of a configuration of a substrate processing system according to another embodiment.

DETAILED DESCRIPTION TO EXECUTE THE INVENTION

Figure 1:
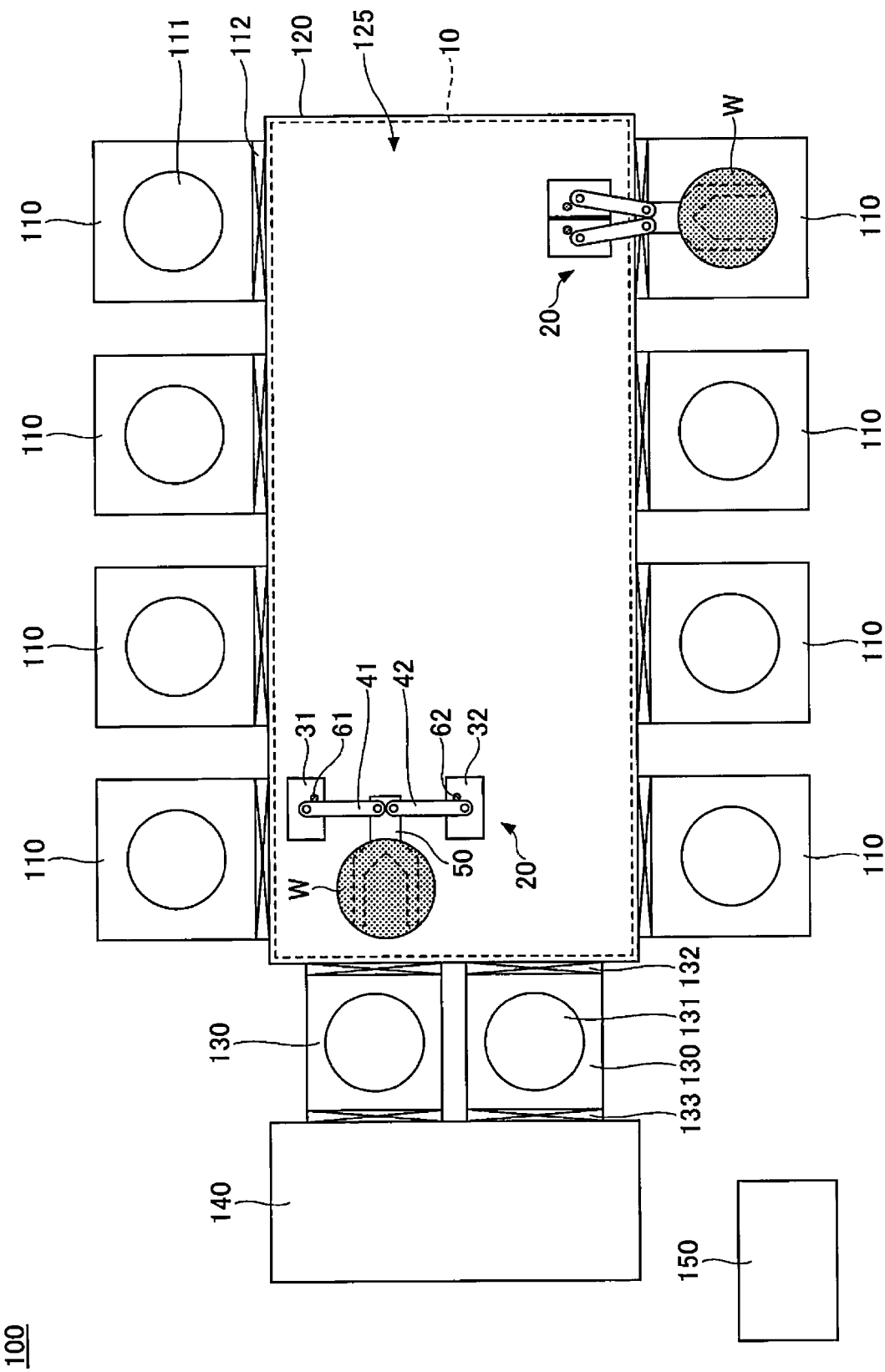
FIG. 1 is a plan view illustrating an example of a configuration of a substrate processing system according to an embodiment.

Hereinafter, embodiments for performing the present disclosure will be described with reference to the drawings. In the respective drawings, the same components will be denoted by the same reference numerals, and overlapping descriptions thereof may be omitted.

<Substrate Processing System 100>

An example of an overall configuration of a substrate processing system 100 according to an embodiment will be described with reference to FIG. 1. FIG. 1 is a plan view illustrating an example of the configuration of the substrate processing system 100 according to the embodiment. FIG. 1 illustrates a wafer W with dot hatching.

The substrate processing system 100 illustrated in FIG. 1 has a cluster structure (multi-chamber type). The substrate processing system 100 includes a plurality of processing chambers 110, a vacuum transfer chamber 120, load lock chambers 130, an atmospheric transfer chamber 140, and a control unit 150.

Each processing chamber 110 is decompressed to a predetermined vacuum atmosphere, and a desired processing (e.g., an etching process, a film forming process, a cleaning process, or an ashing process) is performed on a semiconductor wafer W (hereinafter, also referred to as a "wafer W") inside the processing chamber 110. The processing chamber 110 is disposed adjacent to the vacuum transfer chamber 120. The processing chamber 110 and the vacuum transfer chamber 120 communicate with each other by the opening/closing of a gate valve 112. The processing chamber 110 includes a stage 111 for placing the wafer W thereon. The control unit 150 controls the operation of each unit for performing a processing in the processing chamber 110.

The vacuum transfer chamber 120 is decompressed to a predetermined vacuum atmosphere. A substrate transfer apparatus 125 is provided inside the vacuum transfer chamber 120 to transfer the wafer W. The substrate transfer apparatus 125 includes an end effector 50 that holds the wafer W. The substrate transfer apparatus 125 performs the carry-in/out of the wafer W between the processing chamber 110 and the vacuum transfer chamber 120 according to the opening/closing of the gate valve 112. Further, the substrate transfer apparatus 125 performs the carry-in/out of the wafer W between each load lock chamber 130 and the vacuum transfer chamber 120 according to the opening/closing of a gate valve 132. The control unit 150 controls the operation of the substrate transfer apparatus 125 and the opening/closing of the gate valve 112. The substrate transfer apparatus 125 will be described later with reference to FIGS. 2A, 2B, and 3.

The load lock chamber 130 is provided between the vacuum transfer chamber 120 and the atmospheric transfer chamber 140. The load lock chamber 130 includes a stage 131 for placing the wafer W thereon. The load lock chamber 130 is configured to switch between an air atmosphere and a vacuum atmosphere. The load lock chamber 130 and the vacuum transfer chamber 120 having the vacuum atmosphere communicate with each other by the opening/closing of the gate valve 132. The load lock chamber 130 and the atmospheric transfer chamber 140 having the air atmosphere communicate with each other by the opening/closing of a gate valve 133. The control unit 150 controls the switching between the vacuum atmosphere and the air atmosphere in the load lock chamber 130.

The atmospheric transfer chamber 140 has the air atmosphere, and for example, a downflow of clean air is formed. A transfer apparatus (not illustrated) for transferring the wafer W is provided inside the atmospheric transfer chamber 140. The transfer apparatus (not illustrated) performs the carry-in/out of the wafer W between the load lock chambers 130 and the atmospheric transfer chamber 140 according to the opening/closing of the gate valve 133. The control unit 150 controls the operation of the transfer apparatus (not illustrated) and the opening/closing of the gate valve 133.

A load port (not illustrated) is provided in the wall surface of the atmospheric transfer chamber 140. A carrier that accommodates the wafer W therein (not illustrated) or an empty carrier is attached to the load port. As for the carrier, for example, a front opening unified pod (FOUP) may be used.

The transfer apparatus (not illustrated) may take out the wafer W accommodated in the load port, and place the wafer W on the stage 131 of the load lock chamber 130. Further, the transfer apparatus (not illustrated) may take out the wafer W paced on the stage 131 of the load lock chamber 130, and accommodate the wafer W in the load port.

The control unit 150 includes a central processing unit (CPU), a read only memory (ROM), a random access memory (RAM), and a hard disk drive (HDD). Without being limited to the HDD, the control unit 150 may include other storage areas such as a solid state drive (SSD). In the storage areas such as the HDD and the RAM, a recipe in which a process procedure, a process condition, and a transfer condition are set is stored.

The CPU controls the processing of the wafer W in each processing chamber 110 according to the recipe, and controls the transfer of the wafer W. The HDD or RAM may store a program for executing the processing of the wafer W in each processing chamber 110 or the transfer of the wafer W. The program may be provided by being stored in a storage medium, or may be provided from an external device through a network.

Next, an example of the operation of the substrate processing system 100 will be described. Here, the example of the operation of the substrate processing system 100 will be described according to the operation to perform a processing on the wafer W, which is accommodated in the carrier attached to the load port, inside the processing chamber 110, and accommodate the wafer W in the empty carrier attached to the load port. At the time of starting the operation, the gate valves 112, 132, and 133 are closed, and the inside of the load lock chamber 130 has the air atmosphere.

The control unit 150 opens the gate valve 133. The control unit 150 controls the transfer apparatus in the atmospheric transfer chamber 140 to take out the wafer W from the carrier of the load port, and place the wafer W on the stage 131 of the load lock chamber 130. When the wafer W is placed on the stage 131 of the load lock chamber 130, and the transfer apparatus retreats from the load lock chamber 130, the control unit 150 closes the gate valve 133.

The control unit 150 controls an exhaust device (not illustrated) of the load lock chamber 130 to exhaust the air in the chamber and switch the atmosphere of the load lock chamber 130 from the air atmosphere to the vacuum atmosphere.

Next, the wafer W placed on the stage 131 of the load lock chamber 130 is transferred to the processing chamber 110, and placed on the stage 111. Specifically, the control unit 150 opens the gate valve 132. The control unit 150 controls the substrate transfer apparatus 125 to be described later to insert the end effector 50 into the load lock chamber 130 up to a preset teaching point, and transfer the wafer W placed on the stage 131 of the load lock chamber 130 to the vacuum transfer chamber 120 while holding the wafer W. When the end effector 50 retreats from the load lock chamber 130, the control unit 150 closes the gate valve 132.

The control unit 150 opens the gate valve 112 of the processing chamber 110 which is a transfer destination. The control unit 150 controls the substrate transfer apparatus 125 to insert the end effector 50 into the processing chamber 110 up to a preset teaching point, and place the held wafer W on the stage 111 of the processing chamber 110. When the end effector 50 retreats from the processing chamber 110, the control unit 150 closes the gate valve 112.

The control unit 150 controls the processing chamber 110 to perform a desired processing on the wafer W.

When the processing of the wafer W is completed, the wafer W placed on the stage 111 of the processing chamber 110 is transferred to the load lock chamber 130, and placed on the stage 131. Specifically, the control unit 150 opens the gate valve 112. The control unit 150 controls the substrate transfer apparatus 125 to insert the end effector 50 into the processing chamber 110 up to a preset teaching point, and transfer the wafer W placed on the stage 111 of the processing chamber 110 to the vacuum transfer chamber 120 while holding the wafer W. When the end effector 50 retreats from the processing chamber 110, the control unit 150 closes the gate valve 112.

The control unit 150 opens the gate valve 132. The control unit 150 controls the substrate transfer apparatus 125 to insert the end effector 50 into the load lock chamber 130 up to a preset teaching point, and place the held wafer W on the stage 131 of the load lock chamber 130. When the end effector 50 retreats from the load lock chamber 130, the control unit 150 closes the gate valve 132.

The control unit 150 controls an intake device (not illustrated) of the load lock chamber 130 to supply, for example, clean air into the chamber and switch the atmosphere of the load lock chamber 130 from the vacuum atmosphere to the air atmosphere.

The control unit 150 opens the gate valve 133. The control unit 150 controls the transfer apparatus (not illustrated) to take out the wafer W placed on the stage 131 of the load lock chamber 130, and accommodate the wafer W in the carrier of the load port. When the wafer W is taken out from the stage 131 of the load lock chamber 130, and the transfer apparatus (not illustrated) retreats from the load lock chamber 130, the control unit 150 closes the gate valve 133.

In the substrate processing system 100, for example, the substrate transfer apparatus 125 is configured to transfer the wafer W placed on the stage 131 of the load lock chamber 130 to the stage 111 of the processing chamber 110, and transfer the processed wafer W from the stage 111 of the processing chamber 110 to the stage 131 of the load lock chamber 130. However, the present disclosure is not limited thereto. The substrate transfer apparatus 125 may be configured to transfer the wafer W placed on the stage 111 of one processing chamber 110 to the stage 111 of another processing chamber 110.

<Substrate Transfer Apparatus 125>

Figure 2A:
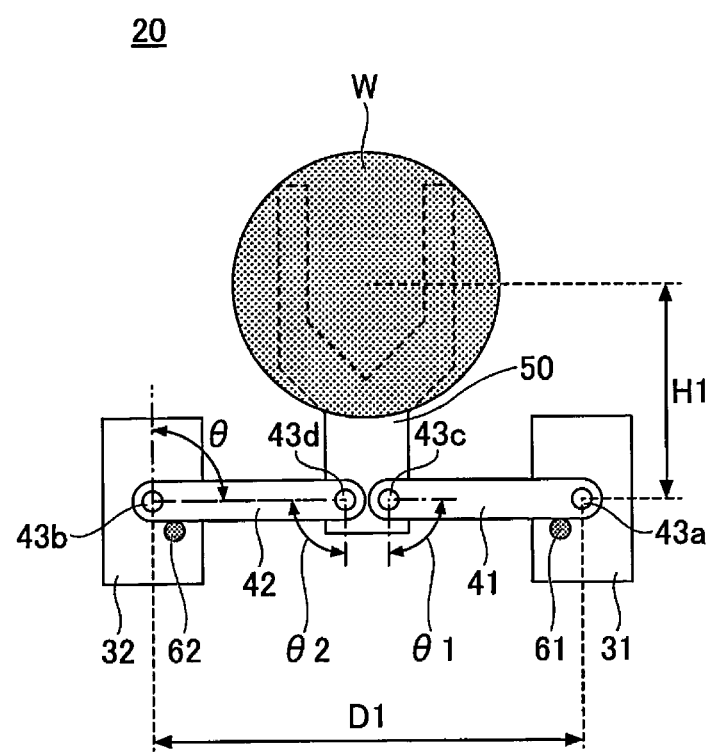
FIG. 2A is a plan view illustrating an example of a transfer unit according to an embodiment.
Figure 2B:
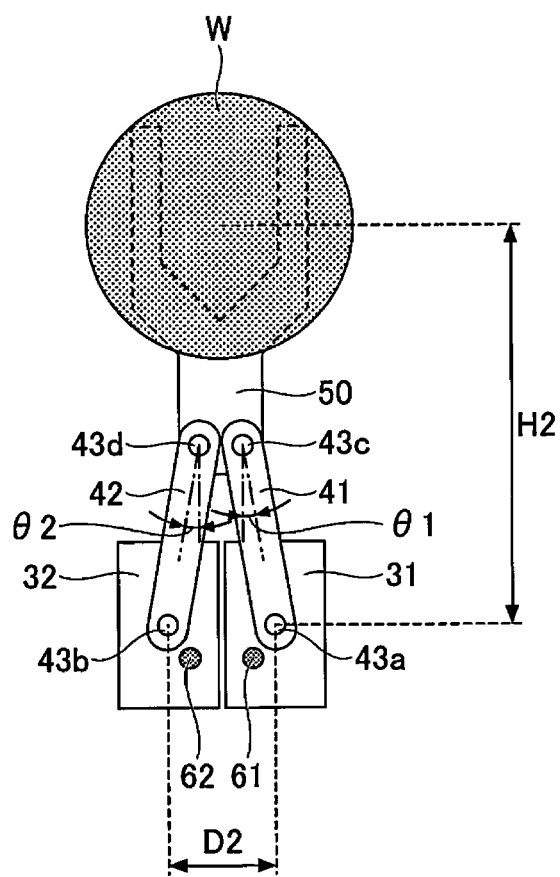
FIG. 2B is a plan view illustrating an example of a transfer unit according to an embodiment.

Next, the substrate transfer apparatus 125 will be further described with reference to FIGS. 2A and 2B. FIGS. 2A and 2B are each a plan view illustrating an example of the transfer unit 20 according to the embodiment. FIG. 2A illustrates an example of the posture of the transfer unit 20. FIG. 2B illustrates another example of the posture of the transfer unit 20.

The substrate transfer apparatus 125 includes a planar motor (linear unit) 10 disposed in the vacuum transfer chamber 120, and the transfer unit 20 movable on the planar motor 10. The transfer unit 20 includes two bases 31 and 32, a link mechanism (links 41 and 42), and the end effector 50. A plurality of transfer units 20 may be provided.

Figure 3:
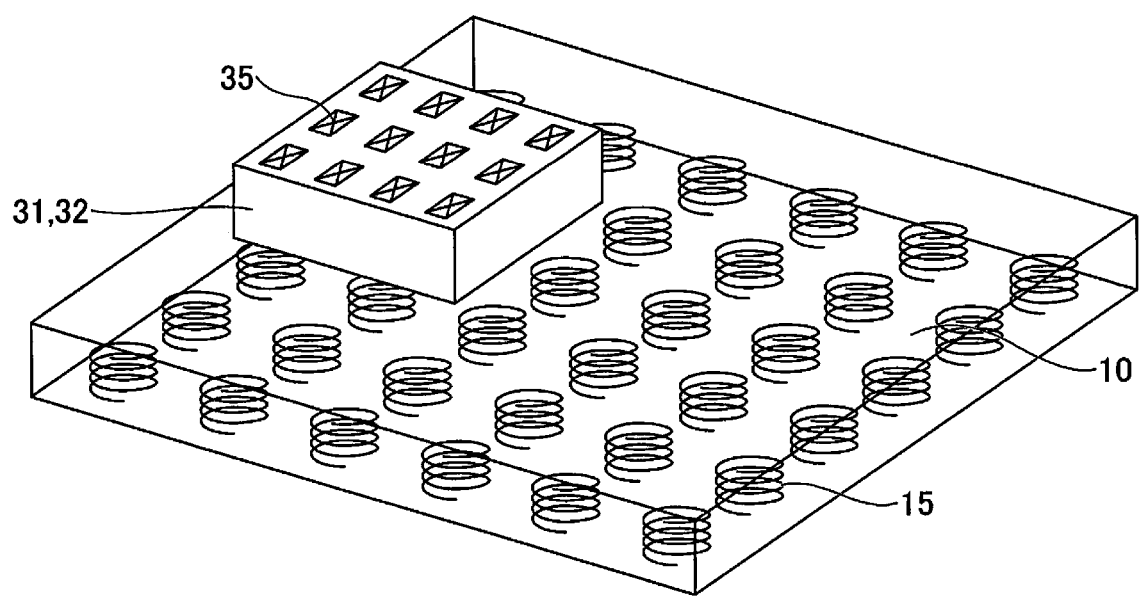
FIG. 3 is a perspective view illustrating a driving principle of a substrate transfer mechanism.

The planar motor 10 and the bases 31 and 32 of the transfer unit 20 will be further described with reference to FIG. 3. FIG. 3 is a perspective view illustrating the driving principle of the substrate transfer apparatus 125.

In the planar motor 10, a plurality of coils 15 is arranged. When a current is supplied, the coils 15 generate a magnetic field. The control unit 150 (see FIG. 1) is configured to be able to individually control a current value that energizes each coil 15.

A plurality of permanent magnets 35 is arranged on the bases 31 and 32. The bases 31 and 32 magnetically levitate on the planar motor 10 by the magnetic field generated by the coils 15. Further, the bases 31 and 32 move on the planar motor 10, by the magnetic field generated by the coils 15.

With this configuration, the control unit 150 (see FIG. 1) is configured to be able to control the positions, the orientations, and the levitation amounts of the bases 31 and 32, by controlling the current value of each coil 15 of the planar motor 10.

Referring back to FIGS. 2A and 2B, the links 41 and 42 make up the link mechanism. The link mechanism connects the two bases 31 and 32 and the end effector 50 to each other. Specifically, one end of the link 41 has a vertical rotary shaft 43a and is rotatably connected to the base 31. The other end of the link 41 has a vertical rotary shaft 43c and is rotatably connected to the end effector 50. One end of the link 42 has a vertical rotary shaft 43b and is rotatably connected to the base 32. The other end of the link 42 has a vertical rotary shaft 43d and is rotatably connected to the end effector 50.

The link mechanism may be configured to move in an interlocking manner with link angles. For example, the link mechanism may include an angle interlocking mechanism (not illustrated) configured such that the angle θ1 formed by the extending direction of the end effector 50 (the direction perpendicular to the line connecting the rotary shafts 43c and 43d) and the link 41, and the angle θ2 formed by the extending direction of the end effector 50 and the link 42 are interlocked to become the same. The angle interlocking mechanism (not illustrated) is configured with, for example, a gear or a belt, and the angle θ2 changes by interlocking with the angle θ1. As a result, the link mechanism may be extended and contracted while maintaining the orientation of the end effector 50, by changing the space between the rotary shafts 43a and 43b.

The end effector 50 is disposed at the end of the link mechanism. The end effector 50 holds the wafer W when the wafer W is transferred.

Next, the operation of the transfer unit 20 will be described. In the following descriptions, the distance from the reference position of the base 31 (e.g., the rotary shaft 43a) to the reference position of the base 32 (e.g., the rotary shaft 43b) will be described as the space between the bases 31 and 32. Further, the distance from the reference position of the bases 31 and 32 (e.g., the line connecting the rotary shafts 43a and 43b) to the reference position of the end effector 50 (e.g., the center position when the wafer W is held) will be described as the extension distance of the end effector 50.

Since the two bases 31 and 32 and the end effector 50 are connected to each other via the link mechanism (the links 41 and 42), the transfer unit 20 has the extension distance H1 of the end effector 50 which is uniquely determined with respect to the space D1 between the bases 31 and 32 as illustrated in FIG. 2A. Further, as illustrated in FIG. 2B, the transfer unit 20 has the extension distance H2 of the end effector 50 which is uniquely determined with respect to the space D2 between the bases 31 and 32. In this way, the link mechanism may change the spaces D1 and D2 between the bases 31 and 32, thereby changing the extension distances H1 and H2 of the end effector 50. That is, the transfer unit 20 may control the spaces D1 and D2 between the bases 31 and 32, thereby increasing and reducing the extension distances H1 and H2 of the end effector 50.

The control unit 150 may control the energization of each coil 15 of the planar motor 10 such that the bases 31 and 32 are placed at desired positions, thereby moving and/or pivoting the transfer unit 20 in the vacuum transfer chamber 120. Further, the control unit 150 may control the energization of each coil 15 of the planar motor 10 such that the space between the bases 31 and 32 becomes a desired space, thereby increasing and reducing the extension distance of the end effector 50.

For example, when the processing chamber 110 or the load lock chamber 130 is accessed, the space between the bases 31 and 32 may be narrowed, thereby increasing the extension distance of the end effector 50, as illustrated in FIG. 2B. As a result, the end effector 50 may be inserted into the processing chamber 110 or the load lock chamber 130, while the bases 31 and 32 are placed on the planar motor 10 provided in the vacuum transfer chamber 120.

For example, when the transfer unit 20 is moved and/or pivoted in the vacuum transfer chamber 120, the space between the bases 31 and 32 may be widened, thereby reducing the extension distance of the end effector 50, as illustrated in FIG. 2A. By causing the end effector 50 that holds the wafer W to approach the bases 31 and 32, the sagging and the vibration of the link mechanism (the links 41 and 42) may be reduced, and the deviation of the wafer W that is being transferred may be reduced.

As illustrated in FIGS. 2A and 2B, the bases 31 and 32 may be provided with stoppers 61 and 62 that restrict the rotation angles of the links 41 and 42. The stoppers 61 and 62 restrict the rotation angles of the links 41 and 42 by being locked with the links 41 and 42. Here, the stopper 62 restricts the rotation angle of the link 42 such that the angle θ of the link 42 becomes less than 90°. The angle θ of the link 42 will be described assuming that the angle θ becomes 0° when the longitudinal direction of the link 42 is parallel to the extending direction of the end effector 50, and 90° when the longitudinal direction of the link 42 is parallel to the straight line connecting the rotary shafts 43a and 43b. Similarly, the stopper 61 restricts the rotation angle of the link 41 such that the angle θ of the link 41 becomes less than 90°. As a result, the end effector 50 may be prevented from moving backward when the space between the bases 31 and 32 is narrowed from the maximum open state, so that the extension distance of the end effector 50 may be uniquely determined with respect to the spaces D1 and D2 between the bases 31 and 32. Further, the links 41 and 42 are prevented from being arranged in a straight line, so that the locking of the link mechanism may be prevented. While the stoppers 61 and 62 have been described to be provided on the bases 31 and 32, the present disclosure is not limited thereto. The stoppers 61 and 62 may be provided on the end effector 50.

As described above, according to the substrate transfer apparatus 125, the control unit 150 may control the energization of each coil 15 of the planar motor 10, thereby controlling the positions, the orientations, and the levitation amounts of the bases 31 and 32. As a result, the position and orientation of the end effector 50 connected to the bases 31 and 32 via the link mechanism (the links 41 and 42) may be controlled. Further, by controlling the space between the bases 31 and 32, the extension distance of the end effector 50 may be controlled.

Here, when the multi-joint arms are used as the substrate transfer apparatus, a penetration portion that the rotary shaft of the multi-joint arms penetrates, and a seal portion are formed in the vacuum transfer chamber 120. Meanwhile, according to the substrate transfer apparatus 125, since the penetration portion that penetrates the vacuum transfer chamber 120, and the seal portion may not be required, the degree of vacuum of the vacuum transfer chamber 120 may be increased. Further, the transfer unit 20 may suppress the generation of dust by magnetically levitating and moving on the planar motor 10.

Further, according to the substrate transfer apparatus 125, the wafer W may be freely transferred. As a result, the degree of freedom in design of the substrate processing system 100 is improved. For example, the space between adjacent processing chambers 110 may be reduced.

Figure 4A:
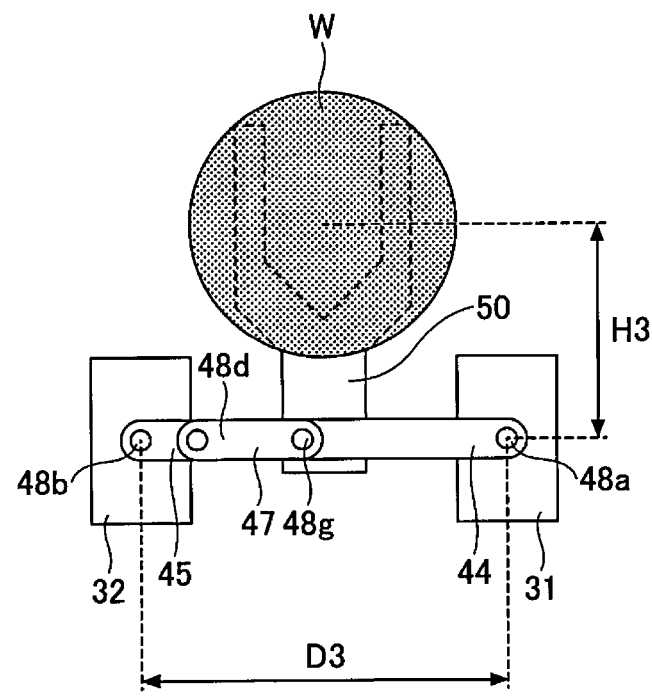
FIG. 4A is a plan view illustrating another example of the transfer unit.
Figure 4B:
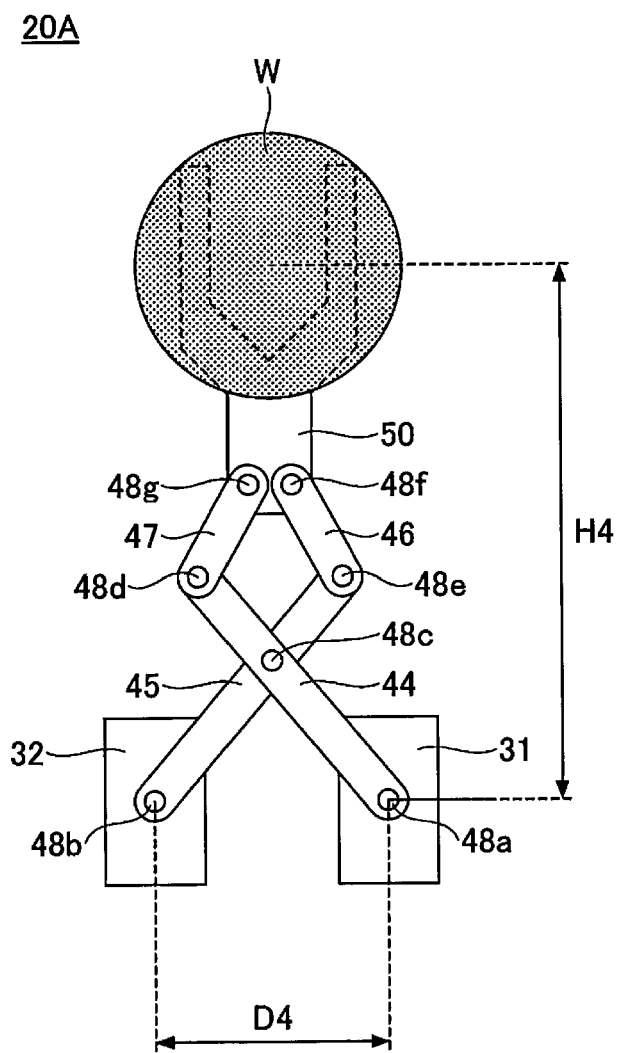
FIG. 4B is a plan view illustrating another example of the transfer unit.
Figure 4C:
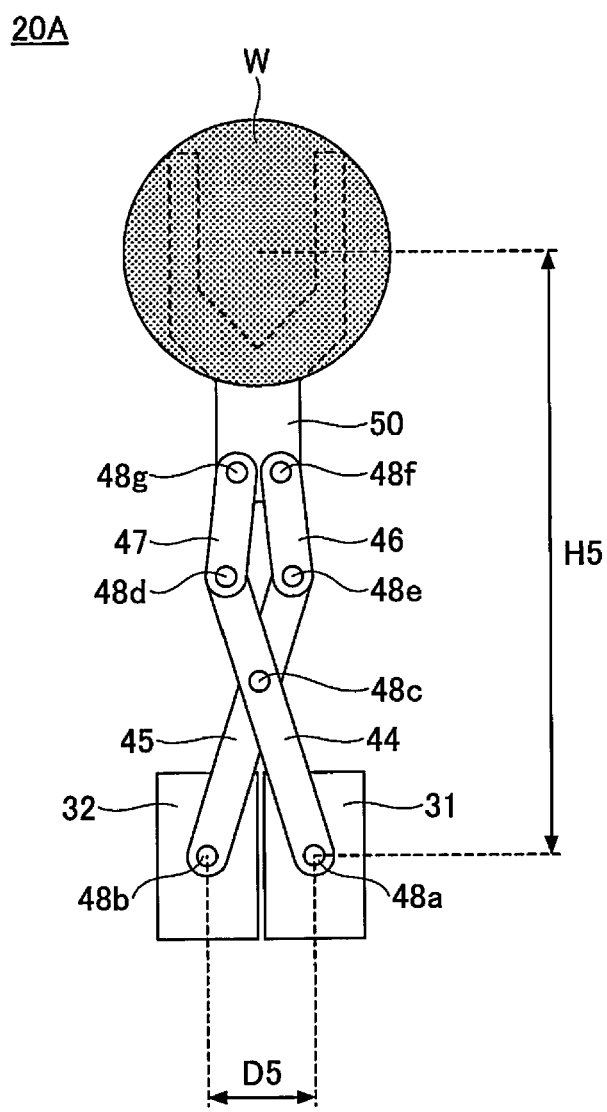
FIG. 4C is a plan view illustrating another example of the transfer unit.

The configuration of the transfer unit 20 is not limited to that illustrated in FIGS. 2A and 2B. FIGS. 4A to 4C are each a plan view illustrating an example of another transfer unit 20A according to an embodiment. FIG. 4A illustrates an example of the posture of the transfer unit 20A. FIG. 4B illustrates another example of the posture of the transfer unit 20A. FIG. 4C illustrates still another example of the posture of the transfer unit 20A.

The transfer unit 20A includes the two bases 31 and 32, a link mechanism (links 44 to 47), and the end effector 50.

The transfer units 20 and 20A are different from each other in that the transfer unit 20 includes the link mechanism configured with the links 41 and 42 and the rotary shafts 43a to 43d, whereas the transfer unit 20A includes the link mechanism configured with the links 44 to 47 and rotary shafts 48a to 48g.

The link mechanism of the transfer unit 20A is configured with the links 44 to 47, and connects the two bases 31 and 32 and the end effector 50 to each other. Specifically, one end of the link 44 includes a vertical rotary shaft 48a and is rotatably connected to the base 31. The other end of the link 44 includes a vertical rotary shaft 48d and is rotatably connected to one end of the link 47. One end of the link 45 includes a vertical rotary shaft 48b and is rotatably connected to the base 32. The other end of the link 45 includes a vertical rotary shaft 48e and is rotatably connected to one end of the link 46. Further, the middle of the link 44 and the middle of the link 45 include a vertical rotary shaft 48c and are rotatably connected to each other. One end of the link 46 includes a vertical rotary shaft 48e and is rotatably connected to the other end of the link 45. The other end of the link 46 includes a vertical rotary shaft 48f and is rotatably connected to the end effector 50. One end of the link 47 includes a vertical rotation axis 48d and is rotatably connected to the other end of the link 44. The other end of the link 47 includes a vertical rotary shaft 48g and is rotatably connected to the end effector 50. The link mechanism may include an angle interlocking mechanism (not illustrated) configured such that the angle formed by the extending direction of the end effector 50 (the direction perpendicular to the line connecting the rotary shafts 48f and 48g) and the link 46, and the angle formed by the extending direction of the end effector 50 and the link 47 are interlocked to become the same.

Since the two bases 31 and 32 and the end effector 50 are connected to each other via the link mechanism (the links 44 to 47), the transfer unit 20A has the extension distances H3 to H5 of the end effector 50 which are uniquely determined with respect to the spaces D3 to D5 between the bases 31 and 32, as illustrated in FIGS. 4A to 4C. In this way, the link mechanism may change the spaces D3 to D5 between the bases 31 and 32, thereby changing the extension distances H3 to H5 of the end effector 50. That is, the transfer unit 20A may control the spaces D3 to D5 between the bases 31 and 32, thereby increasing and reducing the extension distances H3 to H5 of the end effector 50.

<Substrate Processing System 100B>

An example of an overall configuration of a substrate processing system 100B according to another embodiment will be described with reference to FIG. 5. FIG. 5 is a plan view illustrating an example of the configuration of the substrate processing system 100B according to another embodiment. FIG. 5 illustrates the wafer W with dot hatching.

The substrate processing system 100B is different from the substrate processing system 100 (see FIG. 1) in terms of a configuration of a substrate transfer apparatus 125B. The other configurations of the substrate processing system 100B are the same as those of the substrate processing system 100 (see FIG. 1), and overlapping descriptions thereof will be omitted. The substrate transfer apparatus 125B includes the planar motor (linear unit) 10 disposed in the vacuum transfer chamber 120, and a transfer unit 20B movable on the planar motor 10.

<Transfer Unit 20B>

Figure 6A:
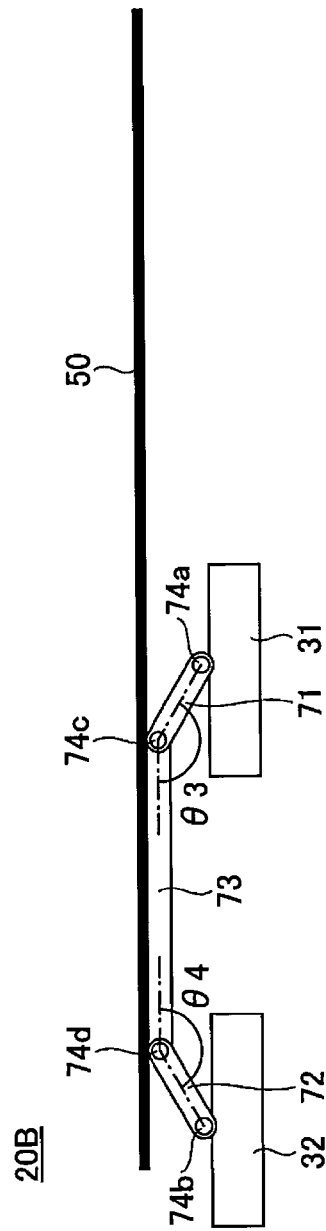
FIG. 6A is a side view illustrating an example of a transfer unit according to another embodiment.
Figure 6B:
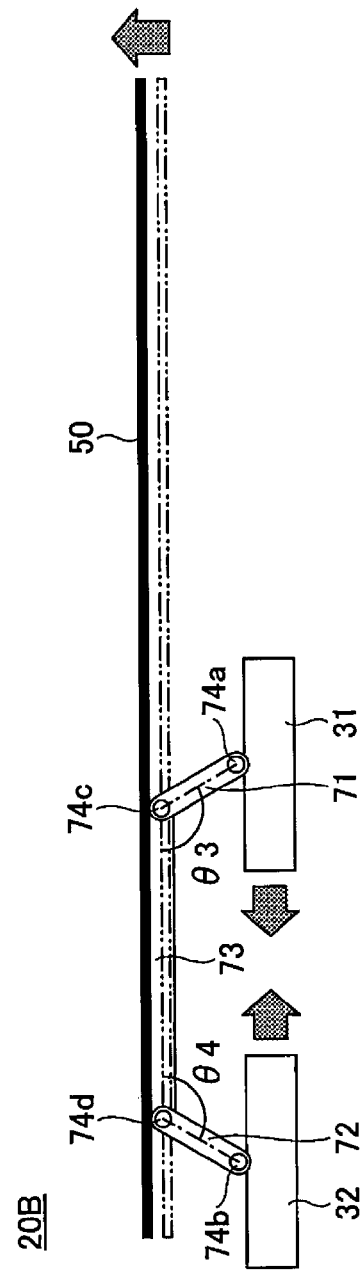
FIG. 6B is a side view illustrating an example of a transfer unit according to another embodiment.
Figure 6C:
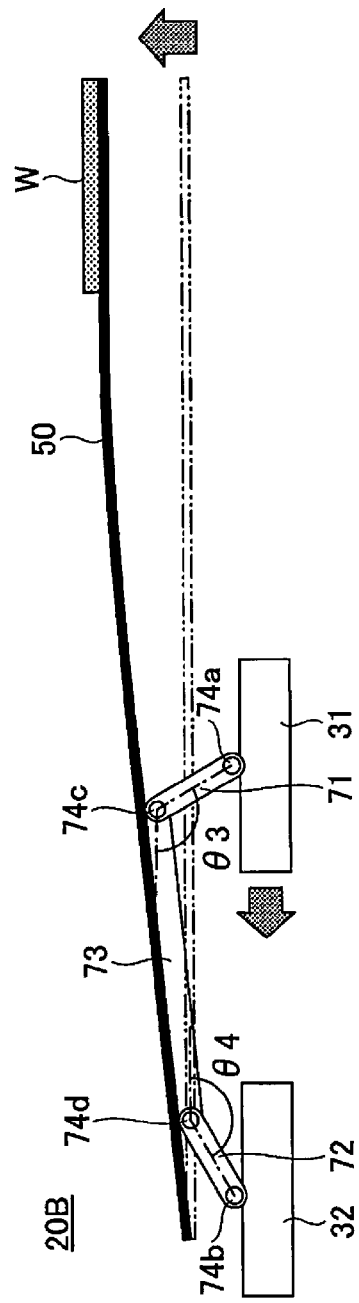
FIG. 6C is a side view illustrating an example of a transfer unit according to another embodiment.

The transfer unit 20B will be further described with reference to FIGS. 6A to 6C. FIGS. 6A to 6C are each a side view illustrating an example of the transfer unit 20B according to another embodiment. The transfer unit 20B includes the two bases 31 and 32, a link mechanism (links 71 to 73), and the end effector 50. A plurality of transfer units 20B may be provided.

In the planar motor 10, the plurality of coils 15 (see FIG. 3) are arranged. When a current is supplied, the coils 15 generate a magnetic field. The control unit 150 (see FIG. 5) is configured to be able to individually control the current value that energizes each coil 15.

The plurality of permanent magnets 35 (see FIG. 3) are arranged on the bases 31 and 32. The bases 31 and 32 magnetically levitate on the planar motor 10 by the magnetic field generated by the coils 15. Further, the permanent magnets 35 receive a pulling or repulsive force by the magnetic field generated by the coils 15, so that the bases 31 and 32 move on the planar motor 10.

With this configuration, the control unit 150 (see FIG. 5) may control the positions, the orientations, and the levitation amounts of the bases 31 and 32 by controlling the current value of each coil 15 of the planar motor 10.

Referring back to FIGS. 6A to 6C, the links 71 to 73 make up the link mechanism. The link mechanism connects the two bases 31 and 32 and the end effector 50 to each other. Specifically, one end of the link 71 includes a horizontal rotary shaft 74a and is rotatably connected to the base 31. The other end of the link 71 includes a horizontal rotary shaft 74c and is rotatably connected to one end of the link 73. One end of the link 72 includes a horizontal rotary shaft 74b and is rotatably connected to the base 32. The other end of the link 72 includes a horizontal rotary shaft 74d and is rotatably connected to the other end of the link 73.

The end effector 50 is disposed at the end of the link mechanism. Specifically, the end effector 50 is fixed to the link 73. Further, the end effector 50 holds the wafer W when the wafer W is transferred. The link 73 may be configured as a part of the end effector 50.

The link mechanism may be configured such that the link angles move in the interlocking manner. For example, the link mechanism may include an angle interlocking mechanism (not illustrated) configured such that the angle θ3 formed by the links 71 and 73 and the angle θ4 formed by the links 72 and 73 are interlocked to become the same. The angle interlocking mechanism (not illustrated) is configured with, for example, a gear or a belt, and the angle θ4 changes by interlocking with the angle θ3. As a result, the link mechanism changes the space between the rotary shafts 74a and 74b, so that the link 73 moves up and down while maintaining the parallel state. That is, as illustrated in FIG. 6A, when the space between the bases 31 and 32 is widened, the link 73 moves down, and the end effector 50 fixed to the link 73 also moves down. Further, as illustrated in FIG. 6B, when the space between the bases 31 and 32 is narrowed, the link 73 moves up, and the end effector 50 fixed to the link 73 also moves up. FIG. 6B uses an alternate long and two short dashes line. Accordingly, as illustrated in FIGS. 6A and 6B, the transfer unit 20B may control the space between the bases 31 and 32, thereby raising and lowering the height of the end effector 50. Thus, since the transfer unit 20B may change the height of the end effector 50, it is possible to transfer the wafer W between the transfer units 20B.

The angle interlocking mechanism (not illustrated) may be configured such that the angle of the link 71 at the rotary shaft 74a and the angle of the link 72 at the rotary shaft 74b are interlocked to become the same. Further, the angle interlocking mechanism (not illustrated) may be configured such that the angle of the link 71 at the rotary shaft 74a and the angle of the link 71 at the rotary shaft 74c are interlocked to keep the parallel state of the link 73. Further, the angle interlocking mechanism (not illustrated) may be configured such that the angle of the link 72 at the rotary shaft 74b and the angle of the link 72 at the rotary shaft 74d are interlocked to keep the parallel state of the link 73.

In the link mechanism, an angle of at least one of the links may be fixed. For example, in the link mechanism, the angle θ4 formed by the links 72 and 73 may be fixed. As a result, as illustrated in comparison with FIGS. 6A and 6C, the link mechanism changes the space between the rotary shafts 74a and 74b, so that the inclination of the link 73 changes. That is, as illustrated in FIG. 6A, when the space between the bases 31 and 32 is widened, the pitch angle (elevation angle) of the link 73 is lowered, and the pitch angle of the end effector 50 fixed to the link 73 is also lowered. As a result, the height of the wafer W held on the front end of the end effector 50 may be lowered. Further, as illustrated in FIG. 6C, when the space between the bases 31 and 32 is narrowed, the pitch angle (elevation angle) of the link 73 is raised, and the pitch angle of the end effector 50 fixed to the link 73 is also raised. As a result, the height of the wafer W held on the front end of the end effector 50 may be raised. Thus, as illustrated in FIGS. 6A and 6C, the transfer unit 20B may control the space between the bases 31 and 32, thereby raising and lowering the height of the end effector 50 at the holding position of the wafer W. Thus, since the transfer unit 20B may change the height of the end effector 50 at the holding position of the wafer W, it is possible to transfer the wafer W between the transfer units 20B.

The end effector 50 has a cantilever structure in which the wafer W is held on the front end thereof (the right side in FIGS. 6A to 6C) and supported by the link 73 at the rear end thereof (the left side in FIGS. 6A to 6C). Further, the end effector 50 is formed in a long shape such that the end effector 50 may access the processing chamber 110 or the load lock chamber 130, while the bases 31 and 32 are placed on the planar motor 10 provided in the vacuum transfer chamber 120.

Thus, the end effector 50 may be bent due to the weight of the wafer W and the weight of the end effector 50 itself. In this regard, by controlling the space between the bases 31 and 32, the holding position of the wafer W on the front end of the end effector 50 may be made horizontal.

While the substrate processing systems 100 and 100B have been described, the present disclosure is not limited to, for example, the above-described embodiments, and various modifications and improvements are made within the scope of the gist of the present disclosure described in the claims.

While descriptions have been made on a case where the substrate transfer apparatuses 125 and 125B are provided in the vacuum transfer chamber 120 having the vacuum atmosphere, the present disclosure is not limited thereto. The substrate transfer apparatuses 125 and 125B may be provided in the transfer chamber having the air atmosphere.

The link mechanism that changes in the extending/contracting direction and the link mechanism that changes in the height direction may be combined with each other. That is, the transfer unit 20 may include a plurality of (e.g., four)

bases 31 and 32, and may be configured to control the extension/contraction and the raising/lowering of the end effector 50.

DESCRIPTION OF SYMBOLS

W: Wafer
100, 100B: Substrate processing system
110: Processing chamber
111: Stage
120: Vacuum transfer chamber
125: Substrate transfer apparatus
130: Load lock chamber
150: Control unit
10: Planar motor
15: Coil
20, 20A, 20B: Transfer unit
31, 32: Base
35: Permanent magnet
41, 42, 44 to 47, 71 to 73: Link
50: End effector (substrate support member)
61, 62: Stopper (locking device)

What is claimed is:

1. A substrate transfer apparatus comprising:
   a transfer unit configured to transfer a substrate into a processing chamber in which the substrate is processed therein, the transfer unit further including:
      a substrate support configured to support the substrate;
      two bases configured to be electro-magnetically levitated on a plane and to be movable on the plane,
      a first link, second link, third link, and fourth link configured to connect the two bases to the substrate support and to be extended in a horizontal direction, such that: one end of the first link is rotatably connected to one of the bases, and a remaining end thereof is rotatably connected to one end of the fourth link; one end of the second link is rotatably connected to a remaining base, and a remaining end thereof is rotatably connected to one end of the third link; the remaining end of the third link is rotatably connected to the substrate support; the remaining end of the fourth link is rotatably connected to the substrate support; and a middle of the first link and a middle of the second link are rotatably connected to each other; and
   a controller configured to control the transfer unit,
      wherein the controller is programmed to control the transfer unit to change an extension amount of the substrate support in the horizontal direction to transfer the substrate into the processing chamber, by changing a space between the two bases.

2. The substrate transfer apparatus according to claim 1, further comprising:
   a stopper configured to restrict a rotation angle of each of the first link and the second link.

3. A substrate processing system comprising:
   a plurality of chambers;
   a transfer chamber configured to connect the plurality of chambers; and
   the substrate transfer apparatus according to claim 1 that is provided in the transfer chamber.

4. The substrate processing system according to claim 3, wherein the transfer chamber is a vacuum chamber having a vacuum atmosphere.

* * * * *